United States Patent
Coomer et al.

(10) Patent No.: US 7,245,001 B2
(45) Date of Patent: Jul. 17, 2007

(54) MULTI-LAYER INTEGRATED CIRCUIT PACKAGE

(75) Inventors: Boyd L. Coomer, Scottsdale, AZ (US); Michael Walk, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 102 days.

(21) Appl. No.: 10/915,803

(22) Filed: Aug. 11, 2004

(65) Prior Publication Data

US 2005/0009353 A1    Jan. 13, 2005

Related U.S. Application Data

(62) Division of application No. 10/109,792, filed on Mar. 29, 2002, now Pat. No. 6,899,815.

(51) Int. Cl.
*H01L 29/40* (2006.01)
*H01L 21/48* (2006.01)

(52) U.S. Cl. ..................... 257/621; 438/112

(58) Field of Classification Search ............ 216/13–18, 216/100, 103; 438/111, 112; 257/771–776, 257/621, 622
See application file for complete search history.

(56) References Cited

U.S. PATENT DOCUMENTS

| | | | |
|---|---|---|---|
| 4,146,440 A | 3/1979 | Thompson | |
| 5,917,157 A * | 6/1999 | Remsburg | 174/252 |
| 6,204,089 B1 | 3/2001 | Wang | |
| 6,326,555 B1 | 12/2001 | McCormack et al. | |
| 6,328,201 B1 | 12/2001 | Inoue et al. | |
| 6,395,582 B1 | 5/2002 | Sohn et al. | |
| 6,525,921 B1 * | 2/2003 | Nakatani et al. | 361/306.3 |
| 6,585,903 B1 | 7/2003 | Belke, Jr. et al. | |
| 2002/0029906 A1 * | 3/2002 | Echigo et al. | 174/265 |

FOREIGN PATENT DOCUMENTS

| | | |
|---|---|---|
| EP | 1069811 A2 | 1/2001 |
| EP | 1154480 A2 | 11/2001 |
| JP | 2001-015877 | 1/2001 |

* cited by examiner

*Primary Examiner*—Calvin Lee
(74) *Attorney, Agent, or Firm*—Blakely, Sokoloff, Taylor & Zafman LLP

(57) ABSTRACT

Adhesive material is applied to a surface of a metallic core layer. The adhesive material is removed from a conductive region of the metallic core layer. A metallic contact is provided over the conductive region of the metallic core layer. The metallic core layer is laminated to an imprinted buildup layer, the buildup layer having a dielectric region and a conductive region, wherein a nonconductive region of the metallic core layer is bonded to the dielectric region of the buildup layer and the conductive region of the metallic core layer is bonded to the conductive region of the imprinted-buildup layer.

11 Claims, 4 Drawing Sheets

MULTI-LAYER INTEGRATED CIRCUIT PACKAGE

CROSS-REFERENCE TO RELATED APPLICATIONS

This application is a divisional of, and claims priority under 35 U.S.C. § 120 from, U.S. patent application Ser. No. 10/109,792, filed Mar. 29, 2002, and issued as U.S. Pat. No. 6,899,815.

BACKGROUND OF THE INVENTION

1. Field of the Invention

An embodiment of the invention relates generally to the field of integrated circuit packages, and more specifically to methods and apparatuses for creating multilayer integrated circuits packages.

One type of integrated circuit package is known in the art as a multi-chip module (MCM) and has a composite multilayered structure including conductive and nonconductive regions that are used to form wiring or circuit lines to connect to semiconductor devices such as very large scale integrated (VLSI) chips and/or discrete circuit elements, etc.

2. Art Background

Integrated circuit packages are currently made using various multi-step processes. The cost to produce the integrated circuit package increases as the number of steps increase that are required to complete the integrated circuit package. Currently, the basic process used for processing an organic substrate such as epoxy follows a series of serial steps. For example, the epoxy substrate is laminated to a copper sheet. Photo resist is applied to the copper sheet. The desired circuit pattern is exposed on the copper using a photo tool. The photo resist is developed to form a photo resist mask and the copper layer is etched in alignment with the photo resist mask, leaving a circuit trace of copper attached to the underlying epoxy substrate in the regions unprotected by the photo resist mask. The photo resist is stripped and the assembly is cleaned.

Through holes are made in the substrate by mechanical or laser drilling. The through holes are cleaned and filled with metal to provide vias within the substrate. Present processes, as described above, require separate steps to form the copper trace and the vias, thereby increasing the cost to produce the finished circuit package. Creation of circuit traces of different depth also requires separate steps since it will be necessary to apply, cure, and remove photo resist for each depth of copper created. Thus, the cost to produce multilayer integrated circuit packages increases rapidly as the complexity of the combined circuit increases.

Current methods of creating vias, such as mechanical or laser drilling, result in the need for pads, vias cannot be placed directly in the copper traces themselves. Thus, circuit board area is wasted due to the need to allocate space to the via for use as a pad.

The previous description of processing an organic substrate such as epoxy would be similar for ceramic or another material. Serial separate steps are required to form the vias and circuit traces on the substrate, which lead to increased cost and lower overall reliability.

BRIEF DESCRIPTION OF THE DRAWINGS

The invention is illustrated by way of example and is not limited in the figures of the accompanying drawings, in which like references indicate similar elements.

DETAILED DESCRIPTION

In the following detailed description, numerous specific details are set forth. However, it is understood that embodiments of the invention may be practiced without these specific details. In other instances, well-known circuits, structures, and techniques have not been shown in detail in order not to obscure the understanding of this description. The following detailed description is, therefore, not to be taken in a limiting sense, and the scope of the invention is defined only by the appended claims.

A metallic core layer fabricated by anodization or similar process is laminated to an imprinted-buildup layer to create a multilayer integrated circuit package. Using imprinting and selective anodic oxidation processes eliminates a number of process steps for creating conductive traces of various depth and vias in the buildup layer and creating plated through holes in the core layer. Following the methods described herein, the vias and any number of different depth/size circuit traces are made in one or both sides of the buildup layer simultaneously. The separate step of filling the vias with metal is eliminated. Distinct conductive regions and nonconductive regions are created in a metallic core layer by selective anodic oxidation. The combination of conductive and non-conductive regions form circuit traces on one or both sides of the metallic core layer. Additional metallic core layers or additional buildup layers can be added to the multilayer integrated circuit package to create additional circuit layers as required by a given integrated circuit package design.

Each buildup layer and each metallic layer, can on each of their respective sides, support a layer of circuit traces and either passive or active devices, attached thereto. Thus, resistors or capacitors can be attached or incorporated into a surface of either the metallic layer or the buildup layer. In various embodiments, these active or passive devices will either be mounted to the outer surface(s) of the integrated circuit package or be contained within layers of the integrated circuit package. In the following description, Aluminum (Al) will be used for the metallic layer. Non-conductive regions formed therein will be an oxide thereof, Aluminum Oxide (AlOx).

Figure 1:
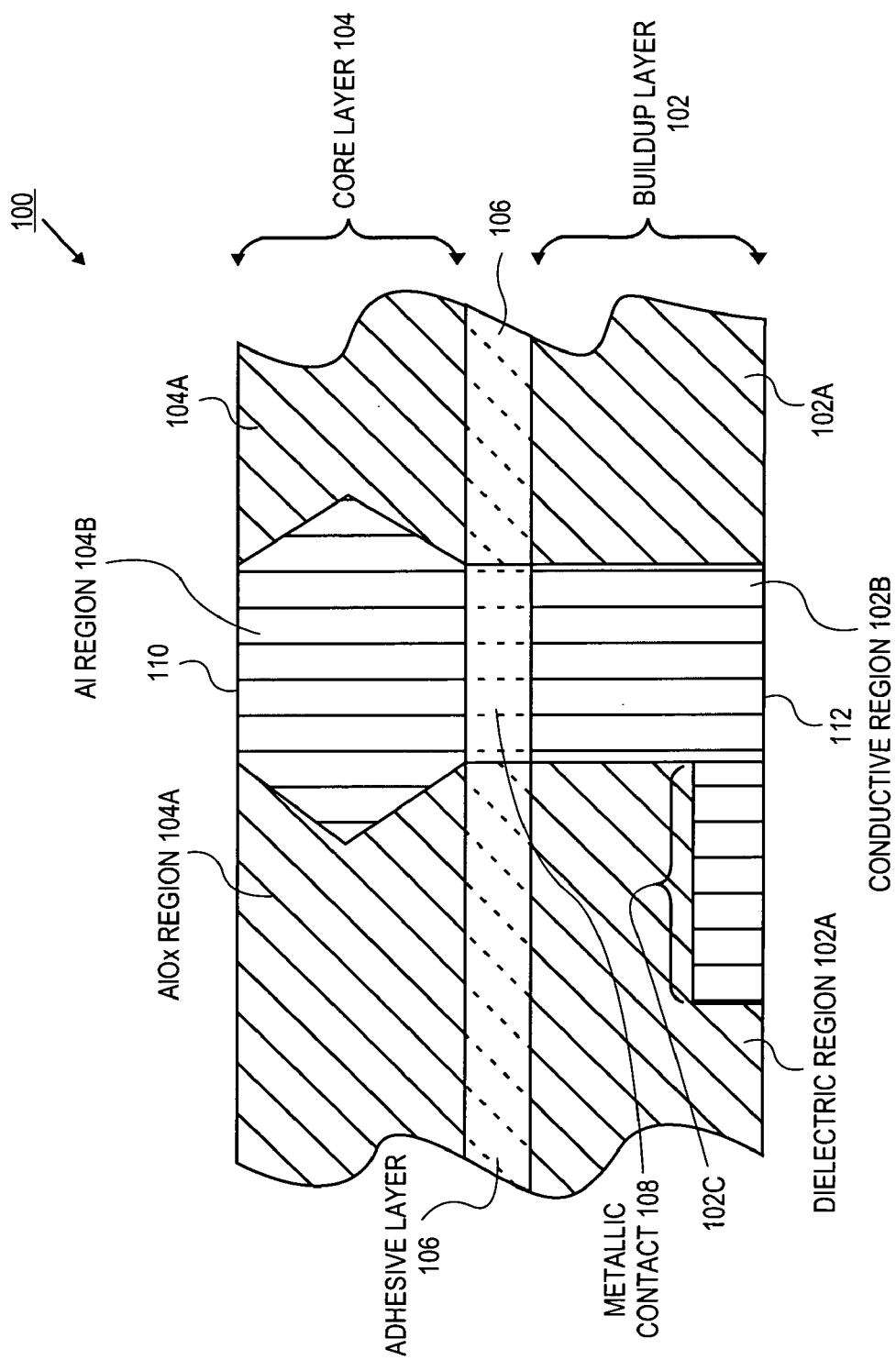
FIG. 1 illustrates a buildup layer and a metallic core layer assembly.

In one embodiment, FIG. 1 illustrates a cross sectional view of a buildup layer and a metallic core layer assembly 100. The view presented in FIG. 1 is a segment of the assembly. With reference to FIG. 1, a core layer 104 contains a non-conductive or dielectric region made of Aluminum Oxide (AlOx) 104a and a conductive region made of Aluminum (Al) 104b. Adjacent to the core layer 104 is a buildup layer 102. The buildup layer 102 contains a dielectric region 102a and a conductive region 102b. In one embodiment, the dielectric region 102a can be made from a Liquid Crystal Polymer (LCP), such as R/max™ from Rogers Corp. Disposed between the AlOx region 104a of the core layer 104 and the dielectric region 102a is an adhesive layer 106. Adhesive layer 106 provides bonding between the AlOx region 104a and the dielectric region 102a of the buildup layer 102. In one embodiment, the adhesive layer 106 is made from a low melting point Liquid Crystal Polymer ($LCP_{LM}$). An appropriate $LCP_{LM}$ material will depend on the material selected for the LCP, which is used for the dielectric region 102a. Some examples of other materials that can be suitable for use as the dielectric region 102a are epoxy, polyethelene and other thermoset and thermoplastic polymers.

In one embodiment, epoxy can be used as the material for the buildup layer 102. In this embodiment, the adhesive layer 106 can be made from the same epoxy as was used for the buildup layer 102, except that the adhesive layer 106 would not be fully cured at the time the core layer 104 was laminated to buildup layer 102, such that adhesive layer 106 still flowed when heated during lamination.

Disposed between the Al region 104b and conductive region 102b is a metallic contact 108. The metallic contact 108 provides electrical continuity between surface 110 and surface 112. The Al region 104b can function as a plated through hole or via within the core layer 104. The Al region 104b in combination with the metallic contact 108 and the conductive region 102b provide the equivalent of a via through the entire thickness of the assembly 100.

The metallic contact 108 can be a layer of solder paste applied to the Al region 104b via a screen printing process as is well known in the art. Commercially available solder paste can be used for metallic contact 108. A tin/silver alloy consisting of 3.5% silver is suitable as well as other solder paste that melts below the melting point of the buildup layer 102. In another embodiment of the invention, the metallic contact can be made with a solder ball placed under compression and/or partially or fully melted by the lamination of the core layer 104 and the buildup layer 102. In yet another embodiment of the invention, the metallic contact 108 can be made using a pre-stressed metallic contact that exerts contact pressure on the opposing faces once placed under lamination pressure conditions. Although the metallic contacts were described with respect to various embodiments of the invention, an embodiment of the invention can be made that includes several different techniques for making the metallic contact and/or the adhesive layer 106 within assembly 100. Thus, the described embodiments of the invention may be combined as needed to achieve the desired results and are not mutually exclusive of one another.

The assembly 100 can be made in a variety of ways. In one embodiment of the invention, the adhesive 106 can be applied to one surface of core layer 104. The adhesive 106 is then removed from the surface of the Al region 104b by laser oblation. Alternatively, the adhesive may be removed from the surface of the Al region 104b by using photolithography plus a chemical etch. Following this alternative approach, a layer of photo resist is applied to the surface of the adhesive layer except for that region of the adhesive in contact with the Al region 104b which is intended for removal. The chemical etch would then remove the adhesive layer in contact with Al region 104b. Solder paste can be applied to the surface of the Al region where the adhesive 106 was just removed. In one embodiment, the solder paste can be screen printed to the surface of the Al. Alternatively, another mechanism can be used for the metallic contact 108, such as a pre-stressed metallic contact described below, in place of the solder paste.

The core layer 104 is aligned with the buildup layer 102 so that the circuit features contained within each layer, 102 and 104, will mate in the intended way according to the circuit design for each layer. As mentioned above the core layer 104 is laminated to the buildup layer 102. The lamination may be performed under a very broad range of conditions. The exact lamination conditions will depend on the particular materials such as LCP, $LCP_{LM}$ adhesive, solder, and/or other metallic contact means employed within the assembly 100. Typical lamination conditions for an LCP/copper buildup layer 102 and the AlOx/Al core layer 104 are 500 degrees Fahrenheit at a pressure of 200 pounds per square inch for 30 minutes. In this example, R/max™ can be used for the LCP. During lamination, the application of heat and pressure causes the solder paste to melt adhering the Al region 104b to the conductive region 102b. Similarly, the adhesive layer 106 causes the AlOx region 104a to be bonded to the dielectric region 102a. In an alternative embodiment, when one of the alternative forms of making the metallic contact 108 is employed, the pressure applied during lamination will deform the pre-stressed metallic contact and/or the solder ball. The bond achieved between the core layer and the buildup layer under lamination pressure conditions provides pressure between the Al region 104b and conductive region 102b, thereby ensuring that the required metallic contact is achieved.

The layers and regions previously described contain a third dimension providing extent into the plane of FIG. 1. According to various embodiments of the invention, the layers and regions previously described may vary from the lengths shown in FIG. 1. No limitation on the invention is implied by the view presented in FIG. 1. Thus, the Al region 104b can have a round cross section or any shape necessitated by the given design. A conductive region 102c can be in contact with the conductive region 102b and can be one continuous piece of conductive material such as copper. In alternative embodiments, conductive polymer, solder, and other conductors can be used in place of copper. The conductive region 102c can be part of a circuit existing in a first layer of circuitry within the assembly 100 and the conductive path between 112 and 110 provides electrical continuity with other planes of circuitry existing at different depths within the assembly 100. The assembly 100 is capable of containing two planes of circuitry per buildup layer or AlOx core layer, however to preserve clarity in the illustration only a minimum number of conductive circuit traces 102c, 102b, and 104b have been included in the view presented by FIG. 1. In general, as discussed previously, a layer of circuit traces and devices can be formed into each side of either the buildup layer 102 or the core layer 104.

Formation of the Buildup Layer

Figure 2A:
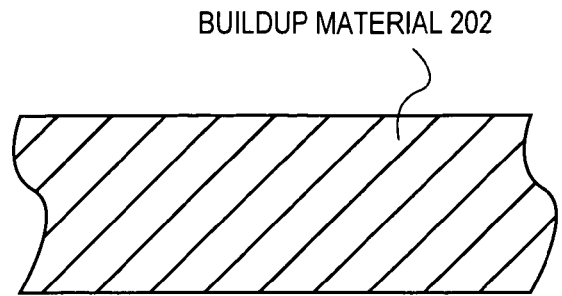
FIG. 2A shows a buildup layer.
Figure 2B:
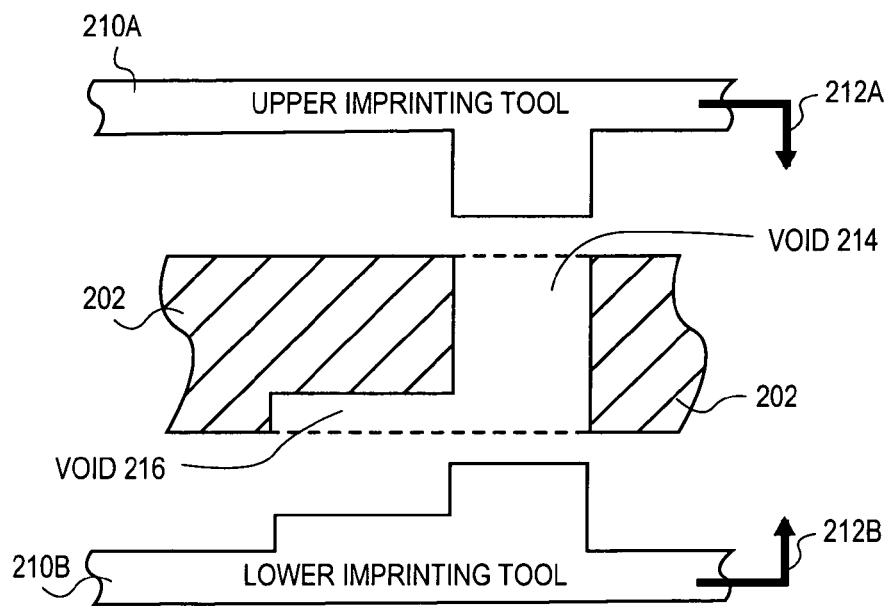
FIG. 2B shows an imprinted buildup layer.
Figure 2C:
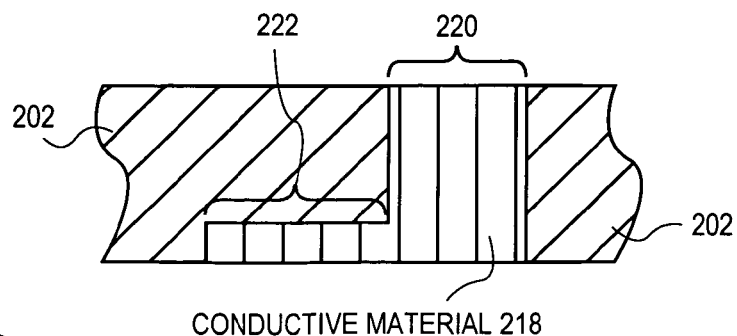
FIG. 2C shows an imprinted buildup layer filled with conductive material.

A process for creating the imprinted buildup layer, such as the one shown in. FIG. 1 at 102 is illustrated in FIGS. 2A, 2B, and 2C. With respect to FIG. 2A, the process starts with a layer of buildup material 202 as shown in FIG. 2A. The layer of buildup material 202 can be LCP as was previously discussed in conjunction with FIG. 1, or another material such as epoxy. The material properties required for the buildup material are the ability to tolerate and maintain a permanent state of plastic deformation and to have the electrical property of a dielectric.

A pattern is imprinted into the surface of buildup material 202 with the use of upper imprinting tool 210a and lower imprinting tool 210b as seen within FIG. 2B. The upper imprinting tool 210a is moved in the direction indicated by arrow 212a. The lower imprinting tool 210b is moved in the direction indicated by arrow 212b. Pressing the imprinting tools into buildup material 202 results in the formation of a void 214 and a void 216. The series of voids that are made during the embossing operation results in one or more circuit lines being molded into the buildup material 202 (FIG. 2B). These voids become circuit lines once the voids are filled with conductive material such as copper and the surface is planarized, as described below. The through holes that result from the embossing operation and a subsequent surface cleaning step result in the formation of vias once the through holes are filed with conductive material such as copper.

Typical nominal dimensions of a width 222 of the void 216 are 5 microns with a depth of 5 to 10 microns (FIG. 2B and FIG. 2C). The typical thickness of the buildup layer 202 is 15–20 microns. Variations from these dimensions are contemplated within the scope of the present invention. The present invention is not limited by the dimensions imprinted into the buildup material 202.

The imprinting tools 210a and 210b are typically made from electroplated Nickle (Ni) or Ni alloys. Other materials can be used to make the imprinting tools. Since the imprinting tool is being used to deform the buildup material 202 it is necessary for the imprinting tool to sustain the forces of imprinting within acceptable limits of wear. Thus, the imprinting tool must necessarily be made from a material that is harder than the material used for the buildup layer. Acceptable limits of wear will be determined by a given application. The present invention is not limited by the material chosen for the imprinting tools 210a and 210b. In various embodiments, either the upper or the lower imprinting tool can be substituted with a planar surface. One layer of circuit traces can be formed thereby on the buildup material 202 with the use of the single imprinting tool and the planar surface.

After the imprinting process, the surfaces of the buildup material 202 must be cleaned (FIG. 2B). In one embodiment, the surfaces are cleaned and roughened with a plasma process. Submicron layers of surface material are removed with the plasma cleaning process. During the imprinting process, certain imprinted features, like the through hole for the via, will result in thin slices and/or pieces of material being left in the void, blocking or partially blocking the void 214 which must be removed during the etching process. Following the cleaning process a seed layer of metal is applied via sputtering or by immersing the polymer in a liquid catalyst. During the sputtering process chrome-copper can be used as the sputtered metal.

In an alternative embodiment, the surfaces can be cleaned and roughened with a chemical etch using a wet etch of sodium permanganate or potassium permanganate. During immersion in the liquid catalyst the emulsion of palladium chloride is absorbed to the surface leaving a very thin layer of palladium over the surface of the buildup layer 202.

The next process is an electroplating process, where a conductive material such as copper is deposited into all of the voids 214 and 216 left in the buildup material 202 resulting in conductive material 218 filling the voids 214 and 216 as shown in FIG. 2C. Following the electroplating process, the surface of 202 is planarized resulting in the layer shown in FIG. 2C. The layer shown in FIG. 2C can be planarized using the techniques that are well known in the art. Planarization of the buildup layer (FIG. 2C) can be achieved by precision grinding the surface using an abrasive brush, an abrasive impregnated compressed organic fiber, sandpaper or an equivalent as is known in the art. Planarization removes the deposited conductive material from the outer surfaces of buildup material 202 and leaves the conductive material 218 within the confines of the voids 214 and 216 (FIG. 2C). The present invention is not limited by the materials or processes chosen for cleaning, roughening, and/or metalizing the buildup layers.

Formation of the Core Layer

Figure 3A:
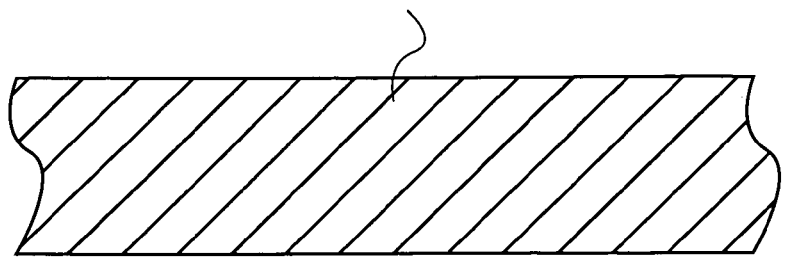
FIG. 3A shows a metallic core layer.
Figure 3B:
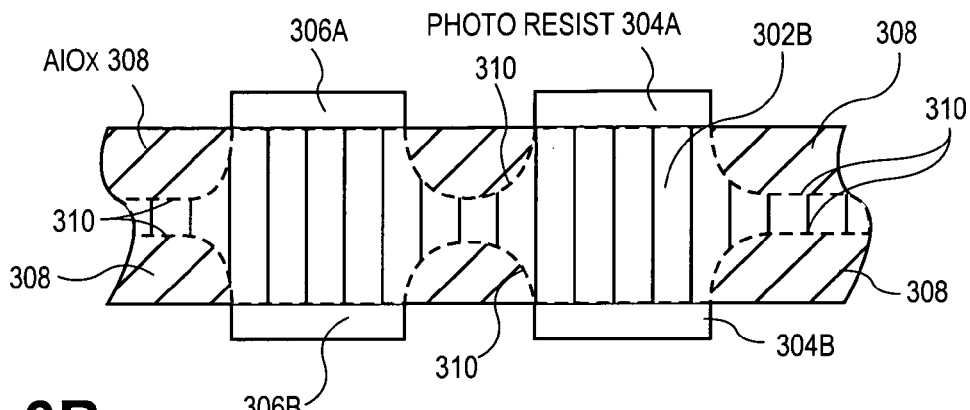
FIG. 3B illustrates an AlOx/Al core layer with photo resist mask applied thereto in a first pattern.
Figure 3C:
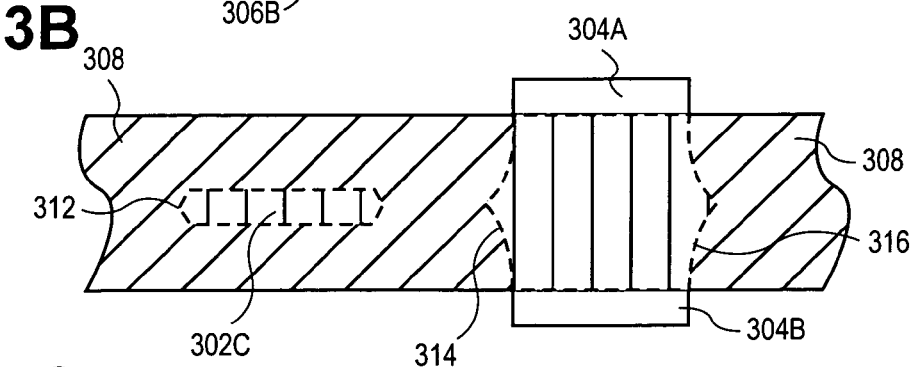
FIG. 3C illustrates an AlOx/Al core layer with photo resist mask applied thereto in a second pattern.

Electrochemical anodic oxidation (anodization) is used to convert Al into AlOx. In one embodiment of the invention, FIGS. 3A, 3B, 3C, and 3D illustrate the process of forming a metallic core layer from a layer of Al by partially anodizing the Al layer. Exposing the Al layer to an anodizing process converts Al into AlOx, a dielectric. The distribution of AlOx and Al within the layer is displayed at four instances in time, using the cross sectional views shown in FIGS. 3A, 3B, 3C, and 3D. The process begins with a conductive layer, in this example a layer of Al 302a as shown at time T1 (FIG. 3A). Photo resist 304a, 304b, 306a, and 306b are applied to the Al 302a layer to prevent anodizing from occurring beneath the areas of photo resist. The anodizing process continues until phase fronts 310 have been formed (FIG. 3B). Distinct regions of AlOx 308 and Al 302b are now created within the layer shown in FIG. 3B.

Figure 3D:
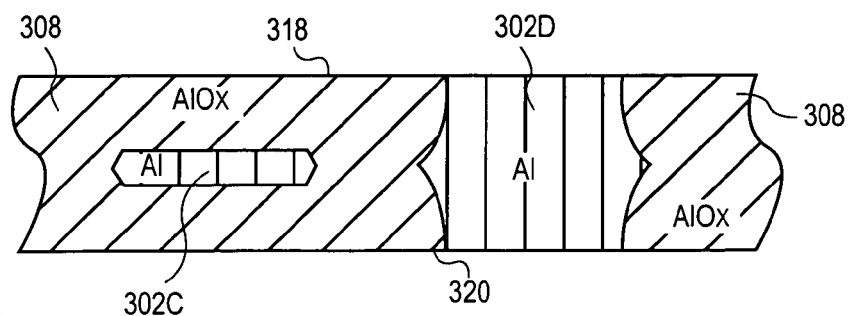
FIG. 3D an AlOx/Al core layer after planarization.
Figure 4:
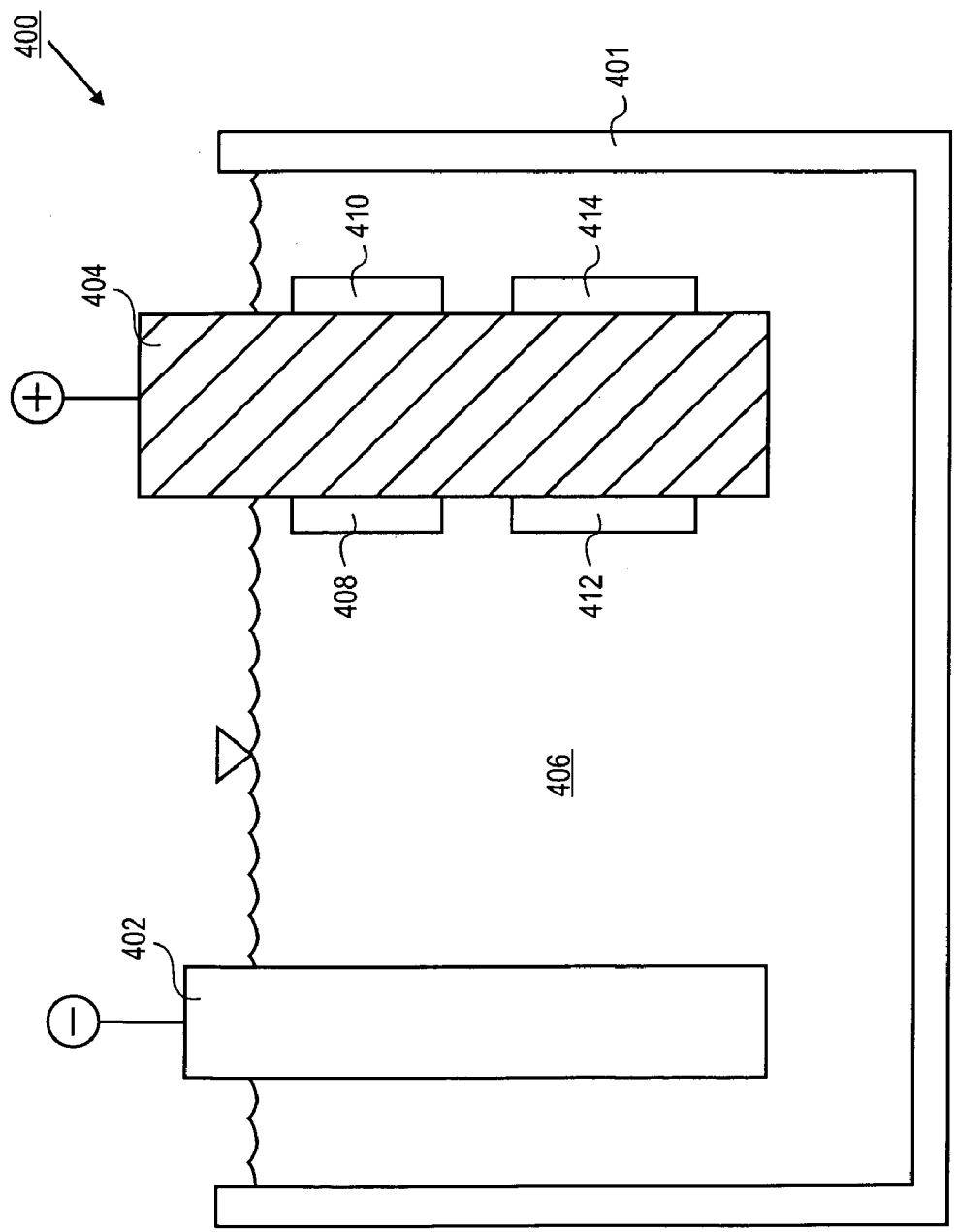
FIG. 4 illustrates an anodizing process.

FIG. 4 displays an arrangement in which electrochemical anodic oxidation can be performed. With respect to FIG. 4, tank 401 contains a solution 406 of weak organic acid or inorganic acid, e.g., boric acid, formic acid, citric acid, etc., or a combination thereof. A cathode 402 and the metallic layer 404 are shown immersed in the solution 406. The metallic layer 404 functions as an anode. The combination of the cathode 402, the anode 404, the solution 406, and an appropriate source of current (not shown) constitutes a galvanic cell. Current is supplied to the system by placing the cathode 402 and the anode 404 at different electrical potentials. During anodizing, selective oxidation of the surface of the anode 404 occurs such that conversion of the conductive regions into non-conductive regions occurs. Exposed regions of the surface of 404, not covered by masking regions 408, 410, 412, and 414, are converted into non-conductive regions. In one embodiment, described previously with respect to FIGS. 3A, 3B, 3C, and 3D, aluminum was the material used to make the conductive region and the aluminum is converted into nonconductive AlOx during anodization. If a different metallic material was used to make the conductive region in the anode, then the converted nonconductive regions will be the respective oxide of the metallic material.

In various embodiments of the invention, process parameters can be adjusted to achieve the desired sequence of conductive and non-conductive regions within the core layer. Two types of non-conductive regions can be formed within the aluminum; a porous and a non-porous region. The porous layer provides the required non-conductive property of the dielectric. The dense region acts as a barrier, protecting conductive regions from the oxidation process currently taking place within an adjacent upper layer. It should be noted that porous or dense regions can be created within each core layer and may exist either singly or in combination with each other in a given core layer. Described below are several non-limiting examples that can be used for the anodizing process to create both porous and non-porous layers.

In the embodiment of the invention described in the following paragraphs the metallic component of the anode 404 is selected to be aluminum. It should be noted that the anode could have been made out of another conductive material other than aluminum, in that case the converted nonconductive regions will be the respective oxide of the metallic material chosen for the anode.

A multi-component electrolyte solution is prepared having oxalic acid with a concentration of 70 grams/liter, citric acid having a concentration of 40 g/liter, and boric acid having a concentration of 16 g/liter. The previously listed acids are mixed in a 1:1:1 proportion and achieve an electrolytic solution having a pH of 1.5. In a first step, anodizing proceeds with a voltage gradient of 1–2 volts/sec from 0 volts up to approximately 40 volts for 40 seconds. In a second step, another set of process parameters keeps the voltage relatively constant at approximately 40 volts for approximately 10–30 minutes until a current density is established in the range of 1–2 ampers/$dm^2$. Anodic oxidation effected according to this process will result in the formation of AlOx to a depth of approximately 2–3 micron.

In the alternative, current density can be monitored to determine the depth of anodizing achieved. For example anodic oxidation can be terminated when the current density falls below 8–9 milliamper/dm$^2$. In practice, AlOx regions with thicknesses of up to 20 microns can be obtained provided the thickness of the original unoxidized aluminum layer is sufficiently thick. It is possible to oxidize the entire thickness of the aluminum layer if the anodizing process is allowed to proceed until the current density measures approximately zero.

A dense region can be used as a barrier to prevent a subsequent anodizing process from changing the character of material situated below or under the barrier. The following non-limiting example of the use of a barrier is provided herein to illustrate one embodiment of using the invention to create a dense region. The process contains the following two steps. First the voltage is increased in a stepwise fashion by increasing the gradient from 1–2 volts from 0 volts up to 300 volts for approximately 5 minutes. Secondly, oxidation proceeds at constant voltage 150–300 volts for approximately 20 minutes until the current density increases from approximately 4 microamperes/dm$^2$ up to 0.05–0.07 ampere/dm$^2$. This current density is associated with the formation of the dense region which has a thickness of 0.02–0.07 microns.

In one or more embodiments of the invention, photo resist can be used to create internal regions of Al that are disconnected from the surfaces of the layer. To create such a feature, the process will proceed with the removal of photo resist 306a, 306b, 304a, and 304b (FIG. 3B). Photo resist mask 304a and 304b is then reapplied to create a mask as shown in view FIG. 3C. Anodizing begins again and continues to convert Al to AlOx. Phase fronts 310, in FIG. 3B, change into phase fronts 312, 314, and 316 in FIG. 3C, thereby creating an Al region 302c which is not in contact with either of surfaces 318 or 320 (FIG. 3D).

Al region 302d extends across the entire width of the layer and was created by keeping photo resist in the locations indicated by 304a and 304b while the anodizing process was in progress. Various embodiments of the invention are possible by combining the previously described steps of applying and removing photo resist and stripping and restarting the anodizing process in order to create various distributions of AlOx and Al. In the previous discussion, directed to forming the Al region 302c, an alternative series of processes could have achieved the same final result. For example, photo resist 306a and 306b could have been absent during the first anodizing process and present during the second anodizing process. The same result is achieved, e.g., a region of Al disconnected from surfaces 318 and 320 as indicated by 302c.

Following the anodizing process, the layers of photo resist are removed using conventional chemical processing as is known in the art and the surfaces 318 and 320 are planarized thereby. Planarization is required because during anodizing the Al increases in volume and swells, thereby creating a non-planar condition. Additional masking and etching processes can be employed to reduce the thickness of the AlOx layer so that the Al region presents a bump in the plane 318 and/or 320. During lamination, the bump provided by the Al region will compress and make contact with the adjacent conductive region of the buildup layer. This is one example of the pre-stressed metallic contact mentioned in an earlier section.

In various embodiments of the invention, a plurality of regions in both the core layer 104 and the buildup layer 102, such as but not limited to those indicated by conductive region 102c and dielectric region 102a (FIG. 1), will be used to make an integrated circuit package that will be used to connect together one or more integrated circuits and or passive or active circuit elements. Integrated circuit packages made according to the teachings of the invention can be used wherever integrated circuits are presently used, eg., in camcorders, cellular telephones, personal data assistants, laptop computers, desktop computers, desk side computers, servers, etc.

While the invention has been described in terms of several embodiments, those of ordinary skill in the art will recognize that the invention is not limited to the embodiments described, but can be practiced with modification and alteration within the scope of the appended claims. The description is thus to be regarded as illustrative instead of limiting.

What is claimed is:

1. An apparatus comprising:
   a core layer having a non-conductive region and a conductive region, wherein the non-conductive region was formed by anodizing;
   a buildup layer having a dielectric region and a conductive region, wherein the buildup layer includes a pattern imprinted therein and/or thereon and metalized;
   an adhesive layer, wherein the adhesive layer is used to adhere the core layer to the buildup layer; and
   a metallic contact, wherein the metallic contact provides electrical continuity between the conductive region of the core layer and the conductive region of the buildup layer.

2. The apparatus of claim 1, wherein an integrated circuit package is formed having four circuit layers.

3. The apparatus of claim 1, wherein solder paste is used to make the metallic contact.

4. The apparatus of claim 3, wherein the solder paste is screen-printed.

5. The apparatus of claim 1, wherein a solder ball is used to make the metallic contact.

6. The apparatus of claim 1, wherein a pre-stressed metallic contact is used to make the metallic contact.

7. The apparatus of claim 1, wherein a liquid crystal polymer layer (LCP) is used for the adhesive material.

8. The apparatus of claim 1, wherein the dielectric region of the core layer is a liquid crystal polymer.

9. The apparatus of claim 1, wherein the metallic region of the core layer is copper.

10. The apparatus of claim 1, wherein the conductive region of the core layer is aluminum (Al).

11. The apparatus of claim 1, wherein the non-conductive region of the core layer is Aluminum oxide (AlOx).

* * * * *